United States Patent
Okojie

(12) 
(10) Patent No.: US 6,248,646 B1
(45) Date of Patent: Jun. 19, 2001

(54) DISCRETE WAFER ARRAY PROCESS

(76) Inventor: Robert S. Okojie, 8550 Ilex Dr., Colorado Springs, CO (US) 80920-5734

( * ) Notice: Subject to any disclaimer, the term of this patent is extended or adjusted under 35 U.S.C. 154(b) by 0 days.

(21) Appl. No.: 09/330,572

(22) Filed: Jun. 11, 1999

(51) Int. Cl.[7] .................................................. H01L 21/30
(52) U.S. Cl. ........................... 438/459; 438/455; 438/456
(58) Field of Search .................................. 438/455, 456, 438/458, 459

(56) References Cited

U.S. PATENT DOCUMENTS

| | | | | |
|---|---|---|---|---|
| 4,661,199 | * | 4/1987 | Looney et al. ........................ | 156/612 |
| 5,652,436 | * | 7/1997 | Stoner .................................... | 257/77 |

* cited by examiner

Primary Examiner—John F. Niebling
Assistant Examiner—Christopher Lattin
(74) Attorney, Agent, or Firm—G. F. Gallinger

(57) ABSTRACT

A method of preparing small wafers for compatibility with conventional large wafer fabrication equipment comprising the following steps: indenting a face of a large wafer to form an array of depressions thereon, each depression sized to matingly accept a lower portion of a small wafer; applying a bonding medium to an exterior side of the depressions on the indented face of the large wafer; matingly fitting the small wafers into the depressions so that the small wafers are positioned in an array on the large wafer; and, removing the top portion of the small wafers standing out of the depressions by chemical mechanical polishing so that the remaining portions of the small wafers then have a uniform thickness generally equal to the depth of the indentations in the large wafer. A preferred aspect of this invention provides for a method as above wherein the small wafer is SiC and the large wafer is made from an amorphous substance which comprises SiC or aluminum nitride.

19 Claims, 1 Drawing Sheet

DISCRETE WAFER ARRAY PROCESS

FIELD OF INVENTION

This invention relates to production of silicon carbide (SiC) wafers. More particularly this invention discloses a method which enables an array of small SiC wafers to be concurrently produced on a larger, industry standard sized wafer. This allows the use of industry standard equipment and dramatically increases production rates.

BACKGROUND OF THE INVENTION

The increasingly pervasive presence of microprocessors in controls has created an increasing demand for sensors in all types of environments so that processes may be more closely monitored, operations may be more finely tuned, and so that efficiencies and emissions may be improved.

Commercially available silicon pressure sensors become unreliable above 200° C. Silicon on Insulator technology has enabled device operation to 300° C., and with costly integrated cooling systems this upper temperature limit has further increased. Large scale production is inhibited by the small size of applicable SiC wafers due to incompatability with conventional semiconductor fabrication facilities.

U.S. Pat. Nos. 5,349,207 and 5,441,911 issued to S. Malhi disclose a structure of SiC bonded to silicon and a method capable of using existing (large) silicon wafer production facilities. One problem with Malhi's structure is that its thermal budget is limited by the silicon substrate. The mismatch in coefficient of thermal expansion between SiC and silicon has the potential to create reliability problems. Another inherent problem with Malhi's structure is that the SiC wafers cannot be precisely and consistently positioned on the silicon substrate. Consequently they cannot be tightly packed. They lack much needed process control. Additionally Malhi's wafers must be sufficiently thick to insure they do not break prior to bonding.

OBJECTS AND STATEMENT OF INVENTION

It is an object of this invention to disclose a method of fabricating SiC wafers in an array on an amorphous substrate. The substrate need not be crystalline. It may be selected to have higher temperature resistance, higher temperature conductivity, and greater ruggedness than silicon. SiC has a higher coefficient of thermal expansion than silicon. In extreme temperature variations this is critical. High thermal conductivity also allows the substrate to act as a heat sink. It facilitates connection of pins thereto and may provide a radiation shield. It is particularly advantageous when integrated devices thereon comprise power transistors. Greater ruggedness is generally advantageous; the substrate may act as a circuit board. It is particularly advantageous in vibration. It is yet a further object of this invention to disclose a method which provides for the production of a precisely positioned array of wafers on a substrate. Tight process control facilitates tight packing and minimal waste. Additionally it is not necessary to undertake expensive epitaxial growth on small multiple surfaces. The cost of conventional SiC wafer production may be reduced by more than an order of magnitude. It is yet a further object of this invention to disclose a method of SiC fabrication which will facilitate production of optimally thin wafers—wafers which will have minimal parasitics when used in devices. Very thin SiC wafers also enable epitaxial growth on a top surface thereof. A final object of this invention is to disclose a structure which will facilitate integrating microelectromechanical devices with CMOS controls, and amplification circuits, on the same substrate.

One aspect of this invention provides for a method of preparing small wafers for compatibility with conventional large wafer fabrication equipment comprising the following steps: indenting a face of a large wafer to form an array of depressions thereon, each depression sized to matingly accept a lower portion of a small wafer; applying a bonding medium to an exterior side of the depressions on the indented face of the large wafer; matingly fitting the small wafers into the depressions so that the small wafers are positioned in an array on the large wafer; and, removing the top portion of the small wafers standing out of the depressions by chemical mechanical polishing so that the remaining portions of the small wafers then have a uniform thickness generally equal to the depth of the indentations in the large wafer.

Another aspect of this invention provides for a method as above wherein the small wafer is SiC and the large wafer is made from an amorphous substance which comprises SiC or aluminum nitride.

Various other objects, advantages and features of novelty which characterize this invention are pointed out with particularity in the claims which form part of this disclosure. For a better understanding of the invention, its operating advantages, and the specific objects attained by its users, reference should be made to the accompanying drawings and description, in which preferred embodiments of the invention are illustrated.

FIGURES OF THE INVENTION

The invention will be better understood and objects other than those set forth will become apparent to those skilled in the art when consideration is given to the following detailed description thereof. Such description makes reference to the annexed drawings wherein.

Figure 1:
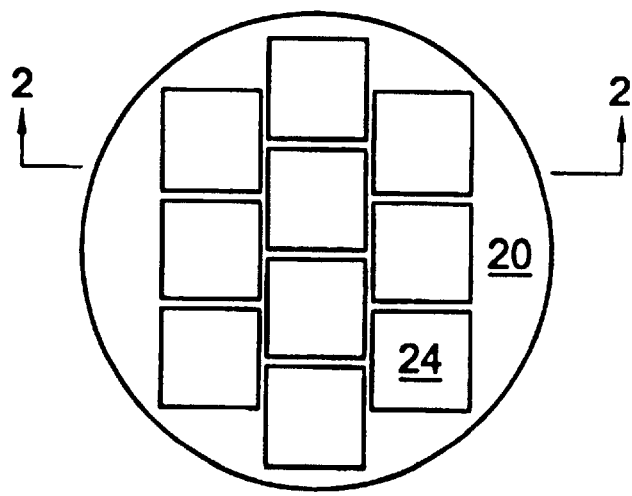
FIG. 1 is a plan view of a large area wafer of substrate having a face indented for an array of small wafers and having small wafers matingly fitted into the depressions thereon.

The following is a discussion and description of the preferred specific embodiments of this invention, such being made with reference to the drawings, wherein the same reference numerals are used to indicate the same or similar parts and/ or structure. It should be noted that such discussion and description is not meant to unduly limit the scope of the invention.

DESCRIPTION OF THE INVENTION

Figure 2:
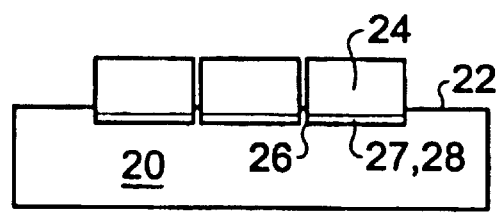
FIG. 2 is a cross sectional view of the large wafer shown in FIG. 1 taken along section line 2—2 therethrough.

Turning now to the drawings and more particularly to FIG. 1 we have a plan view of a large wafer 20 of substrate having a face 22 indented for an array of small wafers 24 and having the small wafers 24 matingly fitted into the depressions 26 thereon. FIG. 2 is a cross sectional view of the large wafer 20 shown in FIG. 1 taken along section line 2—2 therethrough. A method of preparing small wafers 24 for compatibility with conventional large wafer fabrication equipment (not shown) comprises the following steps: indenting a face 22 of a large wafer 20 to form an array of depressions 26 thereon, each depression 26 sized to matingly accept a lower portion of a small wafer 24; applying a bonding medium 27 to an exterior side of the depressions 26 on the indented face of the large wafer 20; matingly fitting the small wafers 24 into the depressions 26 so that the small wafers 24 are positioned in an array on the large wafer 20; and, removing the top portion of the small wafers 24 standing out of the depressions 26 by chemical mechanical polishing.

Most preferably the bonding medium 27 is glass fritz, such as Ferro EG 0002 TM which is fired at 1300° C. Alternatively the bonding medium 27 may be polysilicon which can be fired at 1500° C., and accordingly provides superior bonding.

In this application chemical mechanical polishing is defined to mean chemical and/or mechanical polishing. In this application, applying a bonding medium 27 is defined to include bringing a bonding medium 27 into contact with the depressions 26. For example the bonding medium 27 could be applied to the depressions 26 by first applying it to the small wafer 24, which would be subsequently fitted into the depressions 26.

Most preferably the small wafer 24 is chemically mechanically pre-polished on one face and that face is fitted into a depression 26 on the large wafer 20. The small wafers 24 have a generally uniform thickness and the large wafer 20 is indented a generally uniform depth. When the top portion of the small wafers 24 standing out of the depressions 26 is removed by chemical mechanical polishing the remaining portions of the small wafers 24 then have a uniform thickness generally equal to the depth of the indentations in the large wafer (3 microns) less the thickness of the bonding medium (1 micron) so that their finished depth is generally 2 microns. The top portion of the large wafer 20 acts as a depth indicator in the chemical mechaical polishing process. Chemical mechanical polishing is stopped when the top surface of the small wafer 24 is planar with the top portion of the large wafer 20.

The large wafer 20 may be made from any non-crystalline amorphous substance. The face 22 of the large wafer 20 is most preferably indented by etching; accordingly, an amorphous substance such as SiC which may be etched is preferred. For some applications a chemical vapor deposited Sic is most preferred, while for other applications a coefficient of thermal expansion modified aluminum nitride is most preferred. Most preferably the small wafer 24 is 6H—SiC or 4H—SiC.

Figure 3:
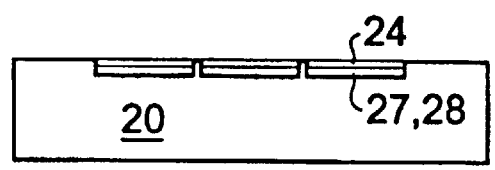
FIG. 3 is a cross sectional view of the large wafer shown in FIG. 1 after a top portion of the small wafers extending out of the depressions has been removed by chemical mechanical polishing.
Figure 4:
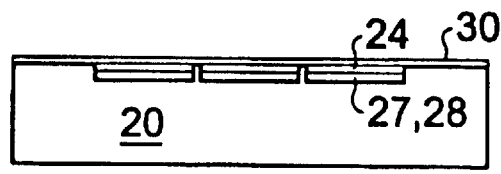
FIG. 4 is a cross sectional view of taken along section line 2—2 in FIG. 1 after the top portion of the small wafers has been removed and a coating has been applied to passivate surface crevices.

FIG. 3 is a cross sectional view of the large wafer 20 shown in FIG. 1 after a top portion of the small wafers 24 extending out of the depressions 26 has been removed by chemical mechanical polishing. In the most preferred method the polished large wafer 20 is cleaned with plasma and an RCA method of cleaning. The polished and cleaned large wafer 20 is then coated with a chemical vapor deposited silicon carbide 30 to passivate the surface crevices (not shown). FIG. 4 is a cross sectional view taken along section line 2—2 in FIG. 1 after the top portion of the small wafers 24 has been removed and a coating 30 has been applied to passivate surface crevices (not shown). In most applications it is preferred that the small wafers 24 be square, although they may sometimes be circular.

While the invention has been described with preferred specific embodiments thereof, it will be understood that this description is intended to illustrate and not to limit the scope of the invention. The optimal dimensional relationships for all parts of the invention are to include all variations in size, materials, shape, form, function, assembly, and operation, which are deemed readily apparent and obvious to one skilled in the art. All equivalent relationships to those illustrated in the drawings, and described in the specification, are intended to be encompassed in this invention. What is desired to be protected is defined by the following claims.

I claim:

1. A method of preparing small wafers for compatibility with conventional large wafer fabrication equipment comprising the following steps:

indenting a face of a large wafer to form an array of depressions thereon, each depression sized to matingly accept a lower portion of a small wafer;

applying a bonding medium to an exterior side of the depressions on the indented face of the large wafer; and, matingly fitting the small wafers into the depressions so that the small wafers are positioned in an array on the large wafer.

2. A method as in claim 1 further comprising the step of removing the top portion of the small wafers.

3. A method as in claim 2 wherein the small wafers have a generally uniform thickness and wherein the large wafer is indented a generally uniform depth.

4. A method as in claim 3 wherein the top portion of the small wafers standing out of the depressions is removed by chemical mechanical polishing and the remaining portions of the small wafers then have a uniform thickness generally equal to the depth of the indentations in the large wafer less the thickness of the bonding medium.

5. A method as in claim 4 wherein the bonding medium is a glass fritz which must be fired to bond the small wafers to the large wafer.

6. A method as in claim 5 wherein the indentations are made by etching.

7. A method as in claim 2 wherein the small wafer is chemically mechanically pre-polished on one face and that face is fitted into a depression on the large wafer.

8. A method as in claim one where the small wafer is Sic.

9. A method as in claim 8 wherein the small wafer is one of 6H—SiC and 4H—Sic.

10. A method as in claim 9 wherein the small wafers are chemically mechanically polished to a finished thickness of generally 2 microns.

11. A method as in claim 9 wherein the large wafer is made from a non-crystalline amorphous substance.

12. A method as in claim 11 wherein the large wafer is chemical vapor deposited SiC.

13. A method as in claim 11 wherein the large wafer is coefficient of thermal expansion modified aluminum nitride.

14. A method as in claim 11 wherein the large wafer is etched to a depth of 3 microns.

15. A method as in claim 4 wherein the bonding medium is a polysilicon.

16. A method as in claim 5 wherein the glass fritz is Ferro EG 0002 TM and is fired at generally 1300° C. to bond the wafers together.

17. A method as in claim 4 further comprising the step of cleaning the polished large wafer with plasma and an RCA method of cleaning.

18. A method as in claim 17 wherein the cleaned and polished wafer is coated with chemical vapor deposited silicon nitride to passivate the surface crevices.

19. A method as in claim 1 wherein the small wafers are square.

* * * * *